US011193958B2

(12) United States Patent
Elliott et al.

(10) Patent No.: US 11,193,958 B2
(45) Date of Patent: Dec. 7, 2021

(54) NON-CONTACT VOLTAGE SENSOR

(71) Applicant: Veris Industries, LLC, Tualatin, OR (US)

(72) Inventors: Randall Brant Elliott, Tigard, OR (US); Mark Steven Taft, Tualatin, OR (US)

(73) Assignee: Veris Industries, LLC, Tualatin, OR (US)

( * ) Notice: Subject to any disclaimer, the term of this patent is extended or adjusted under 35 U.S.C. 154(b) by 354 days.

(21) Appl. No.: 15/788,139

(22) Filed: Oct. 19, 2017

(65) Prior Publication Data
US 2018/0252749 A1 Sep. 6, 2018

Related U.S. Application Data

(60) Provisional application No. 62/466,783, filed on Mar. 3, 2017.

(51) Int. Cl.
*G01R 15/16* (2006.01)
*G01R 27/26* (2006.01)
(Continued)

(52) U.S. Cl.
CPC ............ *G01R 15/16* (2013.01); *G01R 15/06* (2013.01); *G01R 27/2605* (2013.01); *G01R 15/142* (2013.01)

(58) Field of Classification Search
CPC .... G01R 15/06; G01R 27/2605; G01R 15/16; G01R 19/0084; G01R 15/142;
(Continued)

(56) References Cited

U.S. PATENT DOCUMENTS 1,100,171 A 6/1914 Brown
1,455,263 A 5/1923 Oberfell
(Continued)

FOREIGN PATENT DOCUMENTS

DE 10 2010 052346 A1 5/2012
EP 1531334 A2 5/2005
(Continued)

OTHER PUBLICATIONS

European Search Report prepared by the European Patent Office for EP 18158821, dated Aug. 6, 2018, 12 pages.

*Primary Examiner* — Lee E Rodak
*Assistant Examiner* — Brent J Andrews
(74) *Attorney, Agent, or Firm* — Chernoff, Vilhauer, McClung & Stenzel, LLP

(57) ABSTRACT

A sensor for detecting voltage of a power cable includes a housing configured to be coupled around at least a portion of the power cable. A first conductive element supported by the housing is configured to be electrically coupled to the power cable when the housing is coupled around at least a portion of the power cable. A first capacitive element supported by the housing is electrically interconnected with the first conductive element. A second capacitive element supported by the housing is electrically interconnected with the first conductive element. A processor determines a cable capacitance of the power cable based upon alternatively sensing an electrical characteristic (i) the first capacitive element and the second capacitive element and (ii) the first capacitive element without the second capacitive element. The sensor determines the voltage of the power cable based upon the determined cable capacitance.

19 Claims, 22 Drawing Sheets

(51) Int. Cl.
 *G01R 15/06* (2006.01)
 *G01R 15/14* (2006.01)
(58) Field of Classification Search
 CPC ........ H01F 27/263; H01F 27/02; H01F 38/30;
  H01R 13/6683; H05K 1/0268
 See application file for complete search history.

(56) References Cited

U.S. PATENT DOCUMENTS

| | | |
|---|---|---|
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Gotthold |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A * | 1/1993 | Granville ............ G01R 15/183 |
| | | 324/96 |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,473,244 A * | 12/1995 | Libove .................... G01R 1/22 |
| | | 324/126 |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |

(56) References Cited

U.S. PATENT DOCUMENTS

| | | | |
|---|---|---|---|
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,652,871 B2 | 1/2010 | Caggiano et al. |
| 8,085,055 B2 | 12/2011 | Rupert |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,405,383 B2 | 3/2013 | Agrawal et al. |
| 8,421,443 B2 | 4/2013 | Bitsch et al. |
| 8,610,438 B1 | 12/2013 | Sykora et al. |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 2001/0040446 A1 | 11/2001 | Lapinksi |
| 2004/0227503 A1 | 11/2004 | Bowman |
| 2005/0240362 A1 | 10/2005 | Randall |
| 2005/0275397 A1* | 12/2005 | Lightbody ............ G01R 15/142 |
| | | 324/126 |
| 2006/0085144 A1 | 4/2006 | Slota et al. |
| 2006/0103548 A1 | 5/2006 | Borkowski et al. |
| 2006/0164096 A1 | 7/2006 | Kwon |
| 2006/0181242 A1 | 8/2006 | Freed |
| 2006/0238932 A1 | 10/2006 | Westbrock |
| 2007/0153438 A1 | 7/2007 | Caggiano et al. |
| 2008/0303511 A1 | 12/2008 | Grno |
| 2009/0115400 A1 | 5/2009 | Hunter |
| 2009/0115620 A1 | 5/2009 | Hunter |
| 2009/0295370 A1 | 6/2009 | Parker |
| 2010/0117626 A1 | 5/2010 | Wertz et al. |
| 2010/0176960 A1 | 7/2010 | Bitsch |
| 2010/0207604 A1 | 8/2010 | Bitsch |
| 2010/0235122 A1 | 9/2010 | McCrea |
| 2010/0308792 A1 | 12/2010 | Rupert |
| 2011/0098985 A1 | 4/2011 | Lawson |
| 2011/0181124 A1 | 7/2011 | Uesaka |
| 2012/0112681 A1 | 5/2012 | Bonvin |
| 2012/0221278 A1 | 8/2012 | Cook |
| 2012/0235667 A1 | 9/2012 | Agrawal et al. |
| 2013/0024714 A1 | 1/2013 | Fu et al. |
| 2013/0027818 A1 | 1/2013 | McGrail |
| 2013/0144545 A1 | 6/2013 | Fu et al. |
| 2013/0294014 A1 | 11/2013 | Irons |
| 2014/0239964 A1 | 8/2014 | Gach et al. |
| 2015/0028848 A1 | 1/2015 | Lynch et al. |
| 2015/0206645 A1* | 7/2015 | Cook .................... H01F 27/263 |
| | | 336/216 |
| 2015/0293549 A1 | 10/2015 | Lal et al. |
| 2016/0069937 A1* | 3/2016 | Johnson .................. G01R 15/16 |
| | | 324/126 |

FOREIGN PATENT DOCUMENTS

| | | |
|---|---|---|
| EP | 2993480 A1 | 3/2016 |
| WO | 2014/088562 A1 | 6/2014 |
| WO | 2016/175123 A1 | 11/2016 |
| WO | 2016176315 A1 | 11/2016 |

* cited by examiner

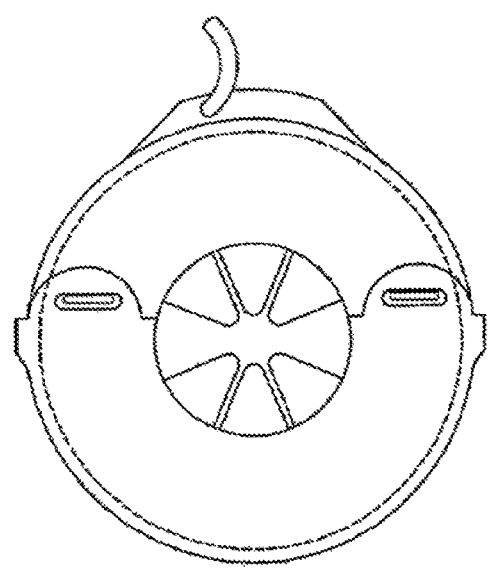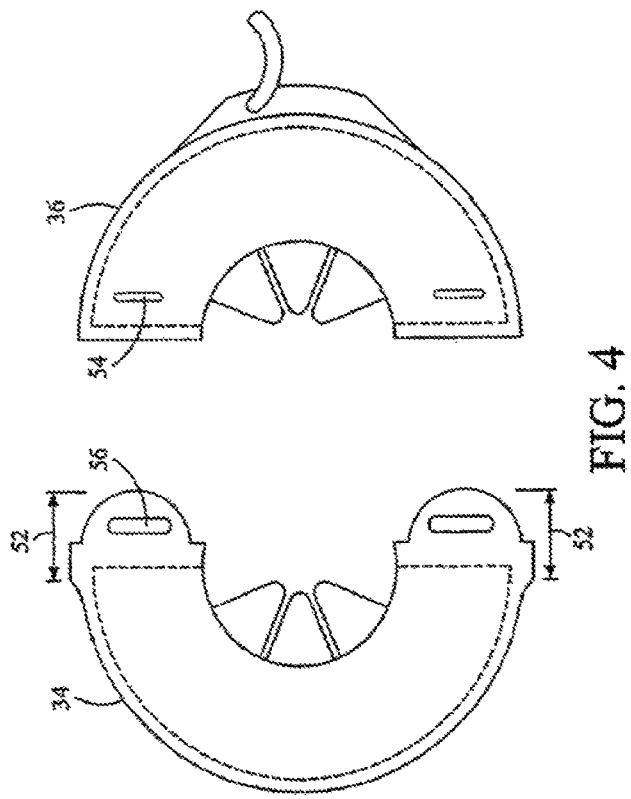
FIG. 3
FIG. 4

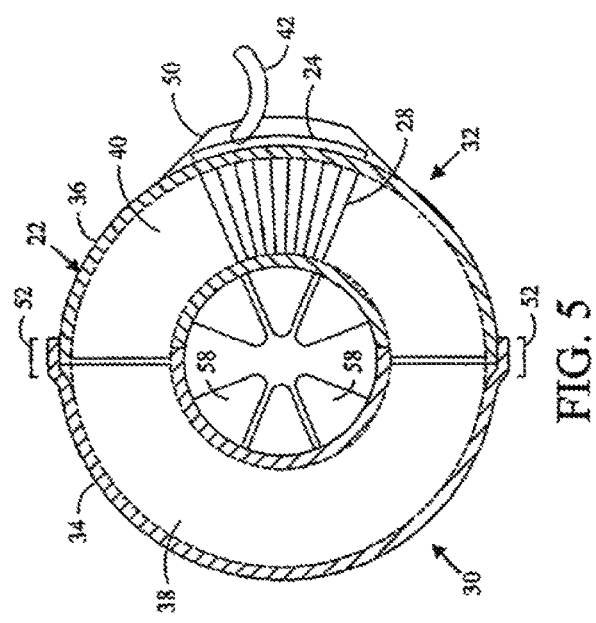
FIG. 5
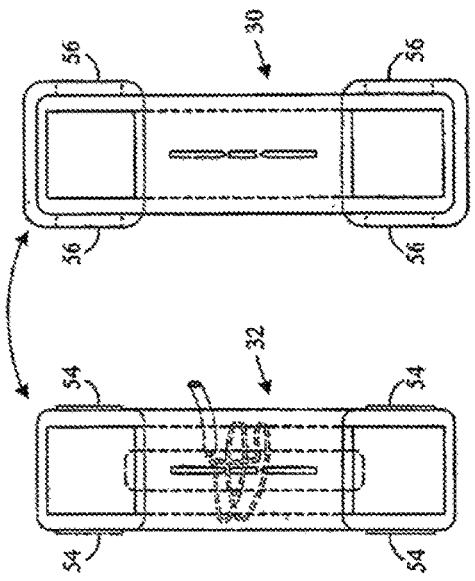
FIG. 6
FIG. 7

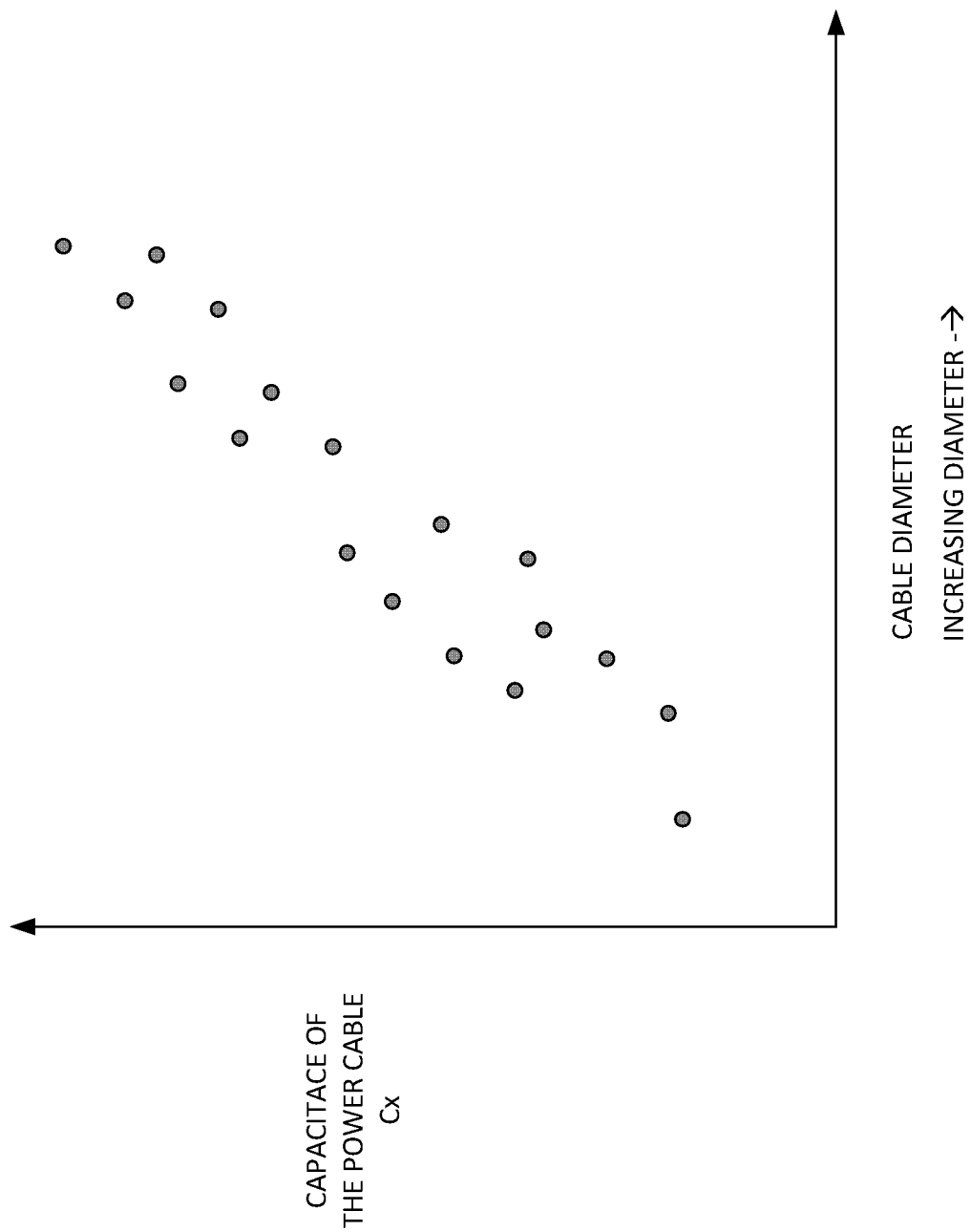

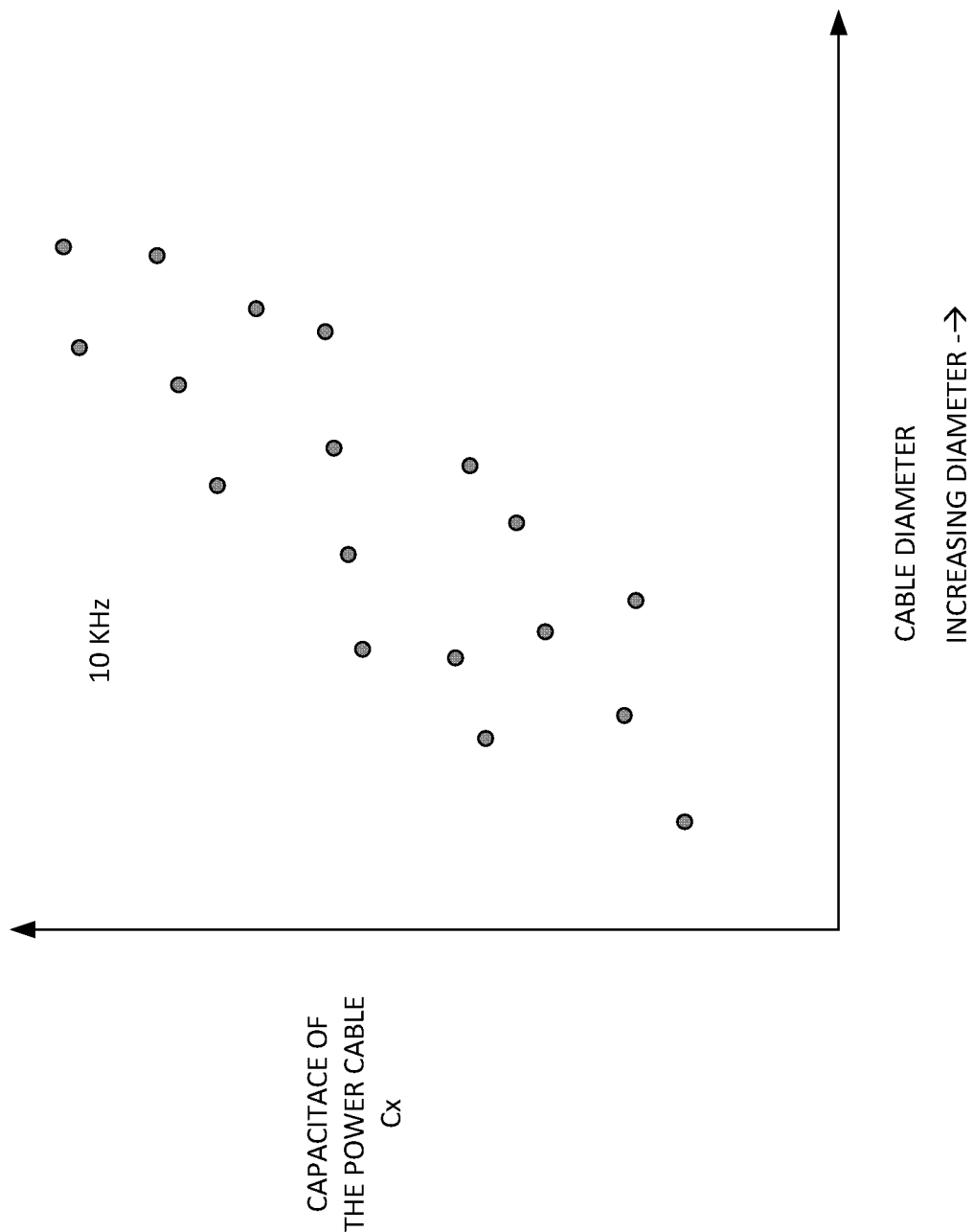

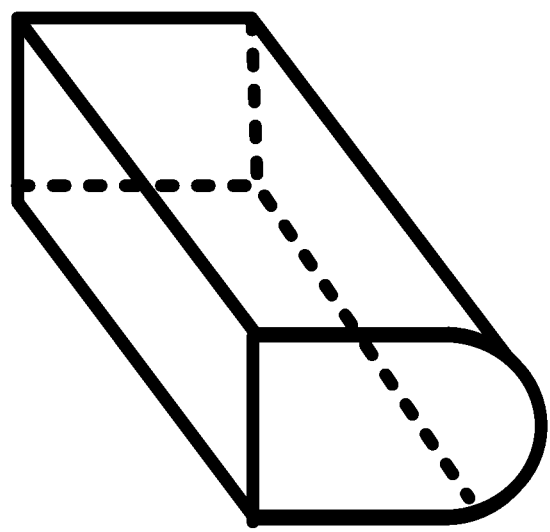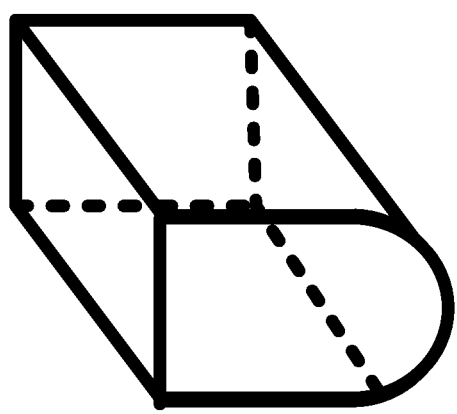
FIG. 19

NON-CONTACT VOLTAGE SENSOR

CROSS-REFERENCE TO RELATED APPLICATIONS

This application claims the benefit of U.S. Provisional Patent Application No. 62/466,783, filed Mar. 3, 2017,

BACKGROUND OF THE INVENTION

The present invention relates to a non-contact voltage sensor.

Currents in each of the branch circuits in a facility are typically measured by connecting a current sensor to sense the current flowing in each of the branch power cables exiting the facility's power distribution panel. Generally, a current sensor comprises a sensing transformer installed on an electrical conductor of interest and an electronic circuit that produces an output representative of the electrical current carried by the conductor. The current sensor may be an individual meter for a single circuit or a networked meter that can be temporarily connected, respectively, to each of a plurality of circuits to periodically and momentarily monitor the current in each circuit.

The typical sensing transformer used to sense the electrical current flowing in a power cable comprises a coil of wire wrapped around the cross-section of a magnetically permeable core that encircles the power cable. A sensing transformer with a hinged, split toroidal core is often used because the transformer can be easily affixed to an installed power cable without disconnecting the power cable from a connected device, such as, a circuit breaker in a distribution panel. Cota, U.S. Pat. No. 5,502,374 discloses a split core sensing transformer comprising a toroidal housing divided into a pair of housing halves. Each half of the housing retains a half of the toroidal core of the transformer. The housing halves are interconnected by a hinge located near one end of each half of the housing. The hinge permits pivoting of the housing halves to separate the ends of the housing halves opposite the hinge. The power conductor is passed between the separated ends of the housing halves and the housing halves are then pivoted together encircling the centrally positioned power conductor with the two halves of the toroidal core. On the ends of the housing halves opposite the hinge, a ridge on one housing half and a matching recess on the other half of the housing form a latch to hold the hinged housing halves closed around the power conductor.

Often it is desirable to monitor the voltage signals of the power cables in order to provide energy and/or power quality measurements. Typically, measuring the voltage of the power cables involve the use of a direct electrical connection with one or more of the power cables. The direct connection is time consuming to install and requires compliance with safety requirements that greatly increase the cost, installation time, and risks involved. The safety requirements are heightened when the wire has high voltages. In addition, requirements related to wiring and fusing may further complicate the installation.

In other cases, measuring the voltage of the power cables involve the use of non-contact capacitive voltage measurements. Such non-contact capacitive voltage measurements are typically of relatively low accuracy as a result of the instability of capacitances in the power cables resulting from physical and environmental conditions. For example, the physical and environmental conditions may be due to dimensional changes, clamping proximity, and dielectric variations of the insulation material of the power cables.

In other cases, measuring the voltage of power cables involves the use of relatively high accuracy non-contact voltage measurement techniques. However, such non-contact voltage measurement techniques are comparatively large, cumbersome to use, and expensive due to their complexity.

It is desirable to have relatively high accuracy in the voltage measurements, while retaining the benefits that occur as a result of the non-contact capacitive voltage measurements.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 3 illustrates a side elevation of a split core sensing transformer.

FIG. 4 illustrates a side elevation of the separated segments of the split core sensing transformer of FIG. 3.

FIG. 5 illustrates a section view of the split core sensing transformer of FIG. 1 taken along line 5-5.

FIG. 6 illustrates a section view of the split core sensing transformer of FIG. 1 taken along line 6-6.

FIG. 7 illustrates a section view of the split core sensing transformer of FIG. 1 taken along line 7-7.

FIG. 10 illustrates a graph of the power cable capacitance versus the cable diameter.

FIGS. 11A-11D illustrate graphs of the power cable capacitance versus the cable diameter.

FIG. 19 illustrates multiple different non-contact capacitive plates.

DETAILED DESCRIPTION OF PREFERRED EMBODIMENT

Figure 1:
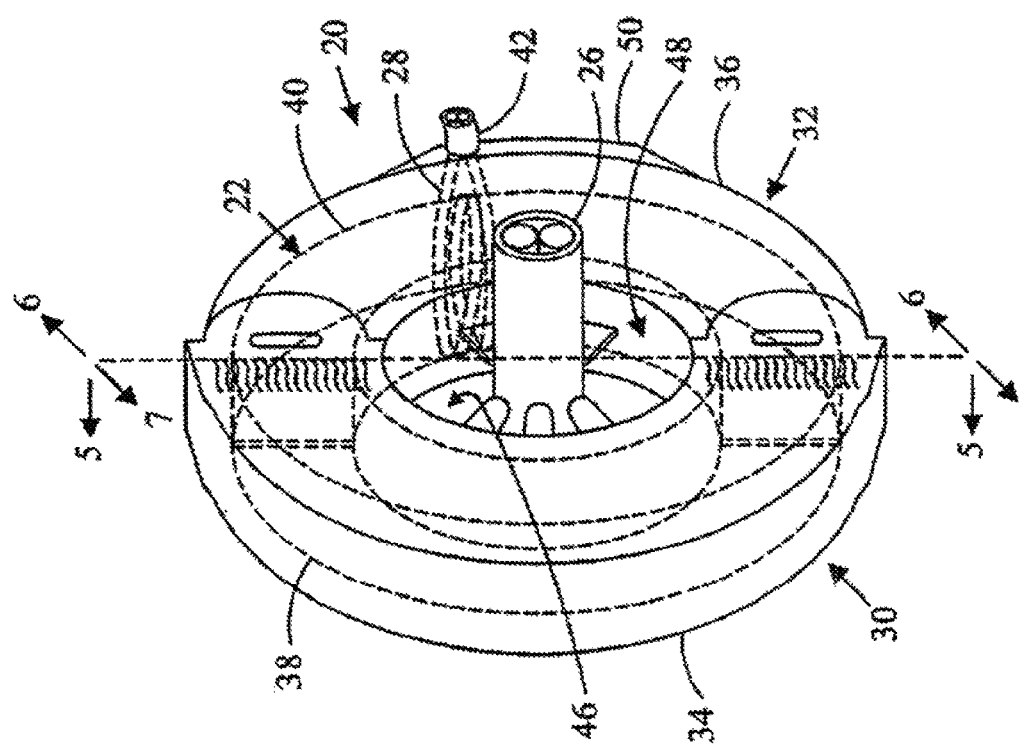
FIG. 1 illustrates a perspective schematic of a split core sensing transformer.

Referring in detail to FIGS. 1-7 where similar parts are identified by like reference numerals, a sensing transformer 20 comprises a magnetically permeable toroidal core 22 that substantially encircles a power conductor 26 (or more than one power conductor) that is connected to conduct an electrical current to be measured. The core 22 is a ferrous torus typically having a rectangular or circular cross-section. One or more turns of wire 28 (or more than one wire) are wrapped around the cross-section of a sector 24 (indicated by a bracket) of the toroidal core 22.

A changing current (i.e. alternating current) in a power conductor produces a changing magnetic field around the conductor which, in turn, induces a magnetic flux in the magnetically permeable core of a sensing transformer encircling the power conductor. The magnetic flux in the toroidal core induces a current in the wire windings that is representative of the current flowing in the power conductor. Thus, the power conductor is the primary winding and the wire winding is the secondary winding of the sensing transformer. The ends of the wire winding are electrically connected to a burden resistor that converts the current signal received from the secondary winding of the sensing transformer to a voltage signal representing the current flowing in the conductor.

Figure 2:
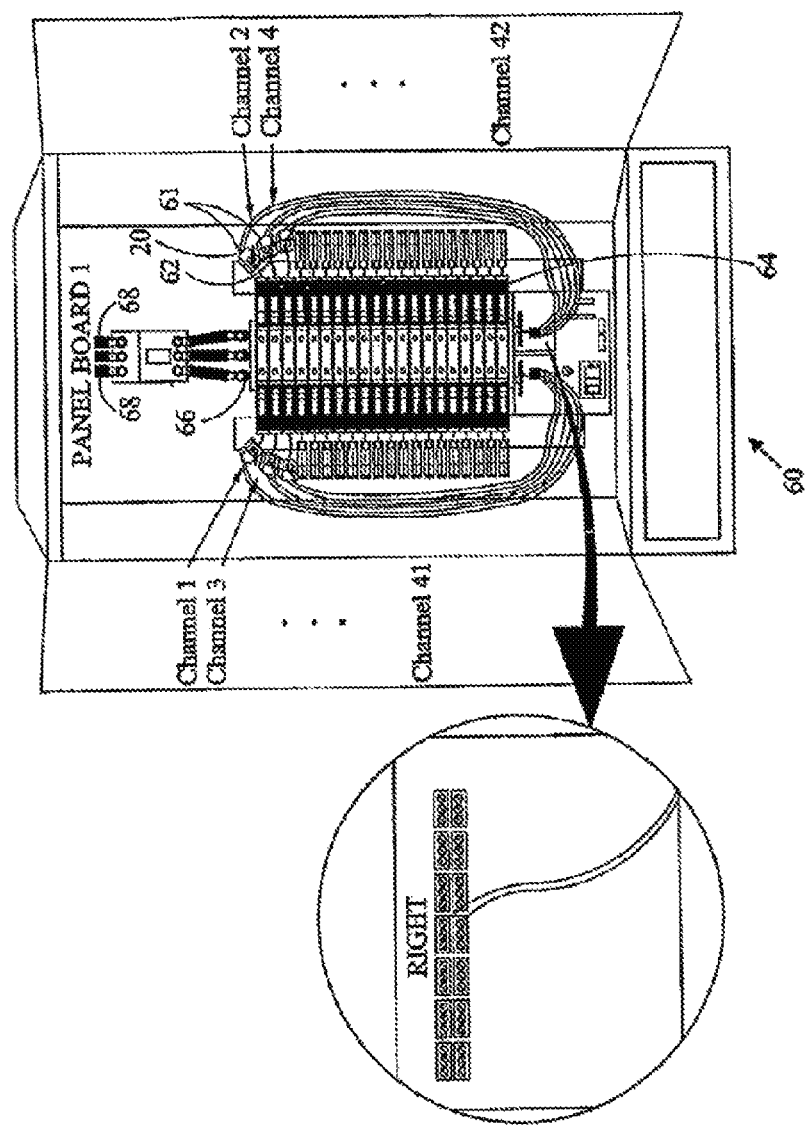
FIG. 2 illustrates a front view of an electrical distribution panel including a plurality of sensing transformers arranged to encircle branch electrical conductors.

To measure the current in several branch circuits in a facility, sensing transformers are installed on each of the respective branch power conductors. Referring to FIG. 2, the sensing transformers 61 are typically installed on the branch power conductors 62 at the distribution panel 60 where the branch power conductors are connected to circuit breakers 64 that protect the branch circuitry from high current. The plurality of circuit breakers 64 are usually arranged immediately adjacent to each other in the distribution panel and are typically connected to bus bars 66 that are, in turn, connected to the input conductors 68 bringing power from the power grid to the distribution panel.

Referring to FIGS. 1-7, the split core sensing transformer 20 preferably comprises at least two separable transformer segments 30, 32. Each segment comprises a respective segment housing 34, 36 and a sector of a magnetically permeable toroidal core 38, 34 that, when installed, will substantially encircle an electrical power conductor 26. One or more turns of wire 28 is wrapped around the cross-section of a sector of the toroidal core 22. An alternating current in a conductor 26 passing through the central aperture 48 of the transformer 20 produces a changing magnetic field around the conductor that induces a magnetic flux in the magnetically permeable core 22. The magnetic flux, in turn, induces a current in the wire windings 28 on the core 22. The ends of the wire winding 28 are electrically connected through a cable 42 to a burden resistor (not shown) that converts the current signal received from the wire winding 28 of the sensing transformer 20 to a voltage signal representing the current flowing in the conductor.

The magnetically permeable core 22 comprises a ferrous material and is constructed of sectors 38, 40 that when arranged end-to-end form, substantially, a torus. The core 22 has a planar cross-section bounded by a closed curve that is typically rectangular or circular. The torus is the result of rotating the planar cross-section about an axis that lies in the plane of the cross-section but does intersect the plane of the cross-section. Each sector 38, 40 of the core 22 includes a curved inner surface 46 which will, when the sectors are arranged end-to-end, define the central aperture 48 of the sensing transformer 20. An exemplary sensing transformer includes a toroidal core of 3% silicon steel, grain oriented, with an outside diameter of 1.375 inches, an inside diameter of 1.125 inches, and a depth of 0.50 inches in a direction parallel to the axis about which the cross-section of the torus is rotated.

The sectors of the toroidal core 38, 40 are retained within respective separable housing segments 34, 36 that substantially sheath the cross-section of the toroidal core sectors. The housing segment 36 that encloses the core sector 40 that is wrapped with the wire winding 28 includes an extended portion 50 that encloses the connections of the wire winding to the conductors in the cable 42 that conducts signals from the wire winding to the instrumentation and provides an anchor for the cable.

A substantially tubular projecting portion 52 (indicated by a bracket) of walls of one of the housing segments 30 projects beyond the ends of the sector of the core 38 retained in the housing segment. The projecting portions 52 are enlarged to provide an interior sufficiently large to slidably accept in mating engagement the ends of the housing 36 of the other transformer segment 32. One of the housing segments 36 also includes a raised ridge 54 projecting from either side of the housing adjacent to the ends of the segment. Each of the raised ridges 54 is arranged to engage a corresponding aperture 56 in the wall of the mating housing segment 36 to prevent the engaged segments from separating. The surfaces of the housing segments 30, 32 that define the central aperture of sensing transformer 20 also include a plurality of resiliently flexible triangular fingers 58 projecting radially inward to provide a central opening for the power conductor 26. If the power conductor is larger than the opening provided by the ends of the triangular fingers 58, the fingers will bend resiliently outward to accommodate the power conductor. Typically, the housing is made of an electrically insulating thermoplastic material such as nylon, polyvinyl chloride (PVC), or polycarbonate.

To install the split core transformer 20 on a power conductor 26, the conductor is positioned between the separated segments 30, 32 of the transformer housing adjacent the surfaces that will form the central aperture 48 of transformer. The cooperating ends of the housing segments 34, 36 are aligned and the segments 30, 32 are pressed into mating engagement. When the housings 34, 36 of the segments 30, 32 are fully engaged, the two sectors 38, 40 of the core substantially encircle the power conductor 26 and the cooperating ridges 54 on the side of the housing of one segment mate with the corresponding apertures 56 in the housing of the other segment. Interference of the ridges 54 with a surface of the apertures 56 resists separation of the segments. The sensing transformer can be removed from the power conductor by inserting a screwdriver or other tool between the segment housings to release the mated ridges and apertures, permitting the segments to be separated. Signals from the sensing transformer are transmitted to the appropriate instrumentation through the cable 42. The housing may be omitted, if desired. A non-split core transformer with or without an associated housing may be used, if desired. The current transformer may be connected to the system by one or more flexible wires, the current transformer may be supported by a circuit board, a plurality of current transformers may be supported by a circuit board, or any other suitable configuration.

Figure 8:
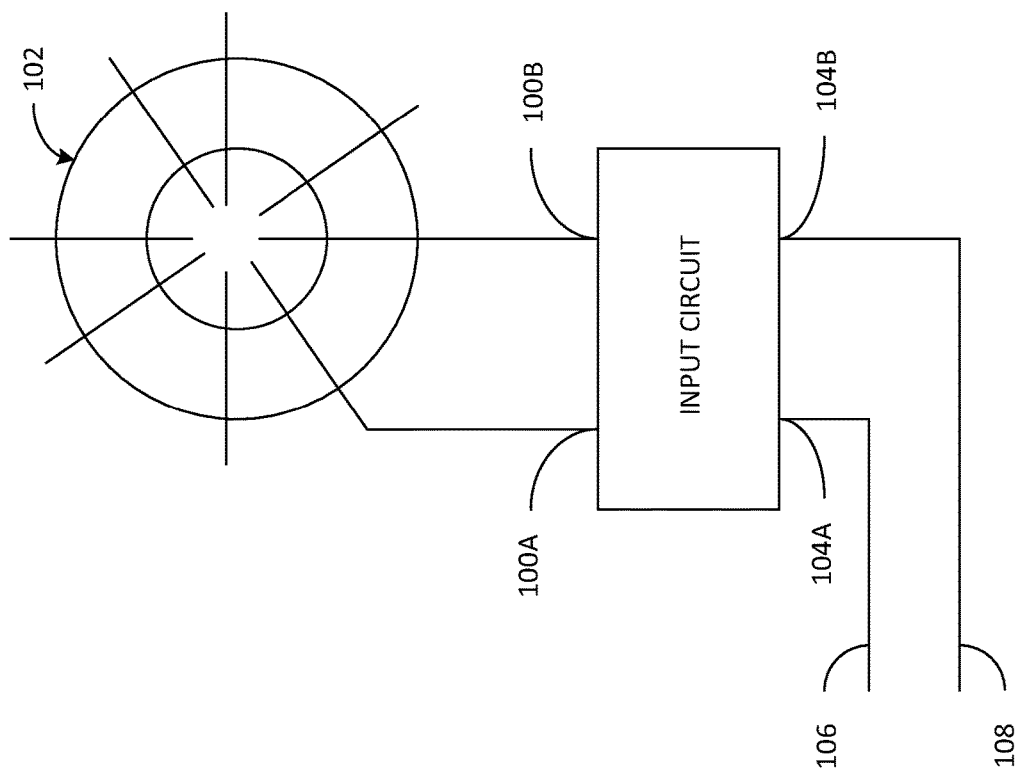
FIG. 8 illustrates a current transformer together with an associated input circuit.

Referring to FIG. 8, the ends of the secondary windings of a transformer (split core, non-split core, high magnetically permeable material, low magnetically permeable material, etc.) 100a and 100b of the transformer 102 are electrically connected to an input circuit 110. The input circuit 110 may be included within a housing associated with the current transformer, may be included as a part of the current transformer, may be included on a circuit board proximate the current transformer, may be included on a circuit board not proximate the current transformer, may be included on a circuit board upon which the current transformer is supported, or any other suitable configuration. The input circuit 110 is designed to convert the voltage signal received from the transformer 102 (such as imposed across a resistor) to either a signal representative of the changing current in the power cable or a circuit condition at the output terminals 104a and 104b representative of the changing current in the power cable. The signal or circuit condition is provided to transmission lines 106 and 108 which are connected to an associated control panel or other electronic device. For example, the signal could be a current signal, voltage signal, or some sort of frequency modulation, amplitude modulation, or digital encoding. The circuit condition, for example, could be a short circuit, open circuit, or other suitable type of condition. The input circuit may be designed and constructed in any manner, so long as it converts the output signal from the transformer to an appropriate corresponding signal or circuit condition.

The current transformer(s) and the associated input circuit may be calibrated in some manner so that there is a known relationship between the changing current levels of the power conductor, and the resulting induced current and/or voltage in the wire. The calibration should model the relationship between the changing current levels and the induced current so that the changing current levels may be accurately estimated. Such calibration may be performed in a manual manner by changing the physical properties of the current transformer until it is within desirable tolerances. Similarly, this calibration relationship may be in the form of one or more scaling factors, one or more functions, one or more look up tables, and/or one or more electronic components to tune the calibration. The calibration factors, functions, tables, and/or electronic components may be included together with the current transformer or otherwise provided in association with the current transformer so that a suitable calibration may be achieved. In addition to the calibration, it is desirable to calibrate the scale of the output of the input circuit.

While the measurement of the current is a desirable characteristic to determine, it is also desirable to determine the voltage of the power cables using a non-contact capacitive based technique. In this manner, the voltage of the power cables may be determined with sufficient accuracy without the need to break the insulation barrier of the transmission line to provide a direct electrical connection to the conductor(s) contained therein.

In some cases, measuring the voltage of the power cables involve the use of non-contact capacitive voltage measurements. Such non-contact capacitive voltage measurements are typically of relatively low accuracy as a result of the instability of capacitances in the power cables resulting from physical and environmental conditions. For example, physical and environmental conditions may be due to dimensional changes, clamping proximity, and dielectric variations of the insulation material of the power cables.

It is desirable to have relatively high accuracy in the voltage measurements, while retaining the benefits that occur as a result of the non-contact capacitive voltage measurements.

Figure 9:
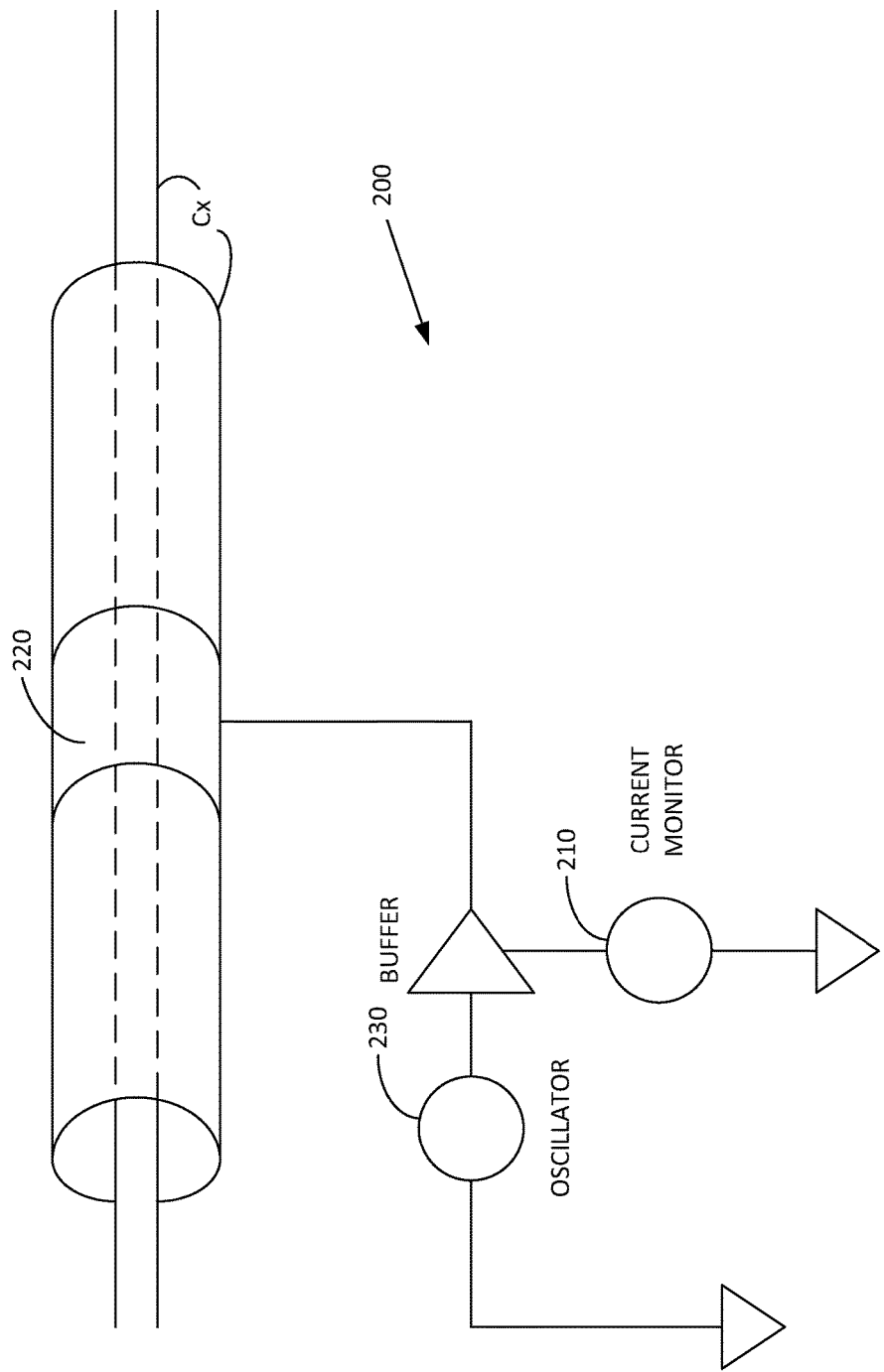
FIG. 9 illustrates a conductor together with a non-contact capacitive based voltage sensor.

Referring to FIG. 9, an illustration of a non-contact voltage sensor 200 is illustrated together with one or more capacitive elements wrapped around the power cable 220, an oscillator 230, a buffer, and a current monitor 210. While the capacitive element 220 may be affixed to the conductor by wrapping the capacitive element around part of the power cable, this results in a problematic installation that includes inherent safety considerations, especially for high voltage environments. In general, a two plate capacitance equation is $C=0.224*K*A/d$ where C is pF, K is a dielectric constant, A is area in square inches, and d is separation in inches. For power cables, the dielectric contact is typically around 2, and the wire insulation thickness defines the plate separation. The plate area is defined by the conductive coupling which may take several forms. One of the forms of conductive coupling around an insulated wire under test may be an array of several conductive blocks or leaves forming a multi-sided iris opening. Another form of conductive coupling is a conductive strap that is wrapped around the insulated wire under test. Another form of conductive coupling is a clamshell style fixture that clamps around the wire. Preferably, the capacitive element is supported by a housing proximate the power cable. Such non-contact capacitive voltage measurements accuracy is affected by variations in the nature of the dielectric material, such as its thickness and material. Further, the capacitive accuracy is further dependent upon the ambient temperature, and the temperature of the dielectric material.

Referring also to FIG. 10, it is believed to be generally understood that as the diameter of the power cable increases together with its insulation encapsulating the conductor(s) therein, the capacitance between the insulation and the conductor of the power cable increases. In this manner, it is desirable to determine such capacitance of the power cable, which may be referred to as Cx for reference purposes. With the capacitance of the power cable Cx being known or otherwise determined in some manner, then the value of Cx together with another capacitor with a known value, which may be referred to as Cl for reference purposes, may be used in combination therewith. With a comparison between Cx and Cl, such as using a voltage divider network, an output voltage level between the two capacitances may be sensed. As the charge on the capacitor Cx of the power conductor varies as a result of the change in the voltage level of the power conductor, the output voltage level between the two capacitances of Cx and Cl changes. The output voltage level is representative of the voltage level in the power conductor.

Figure 11A:
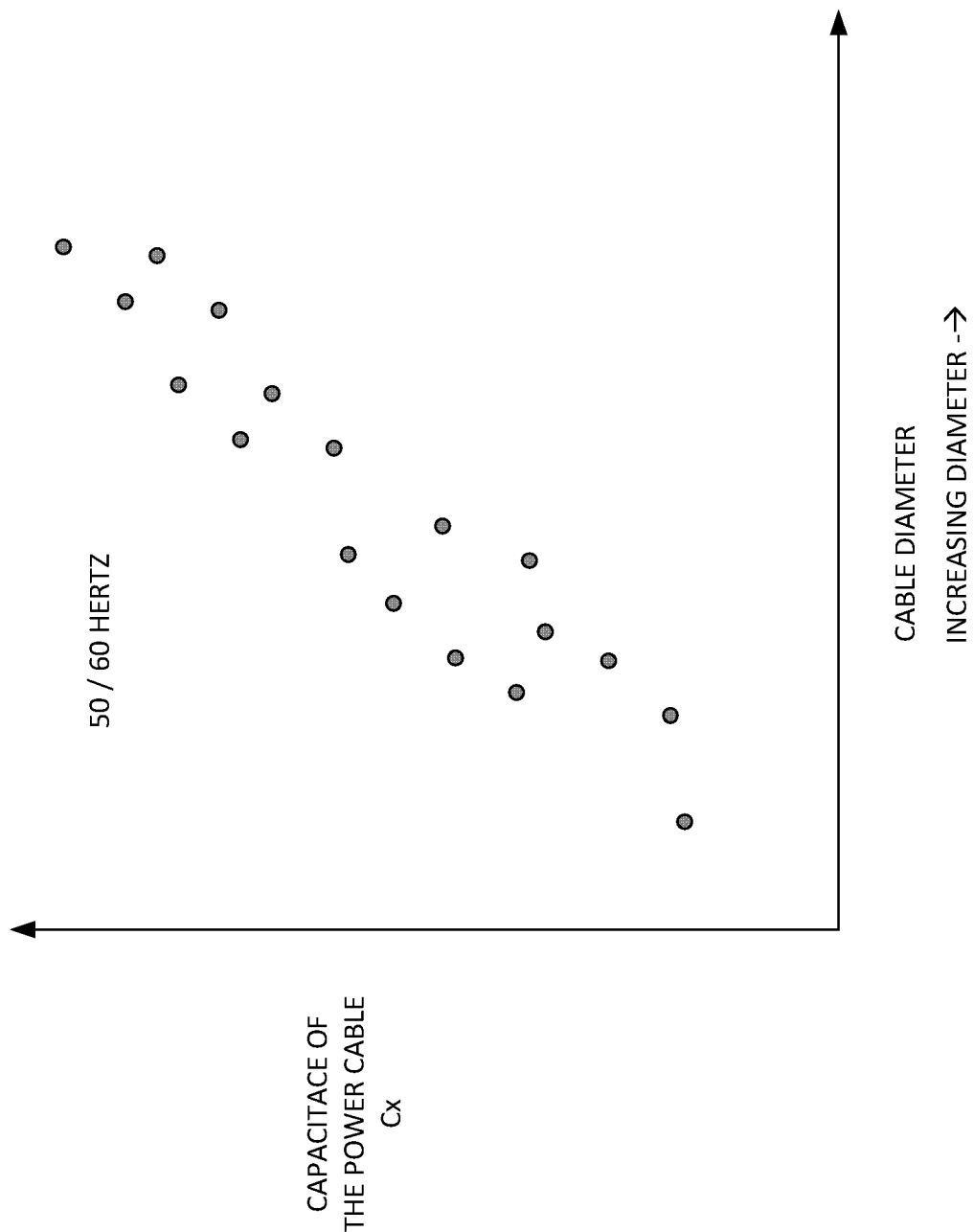
Figure 11C:
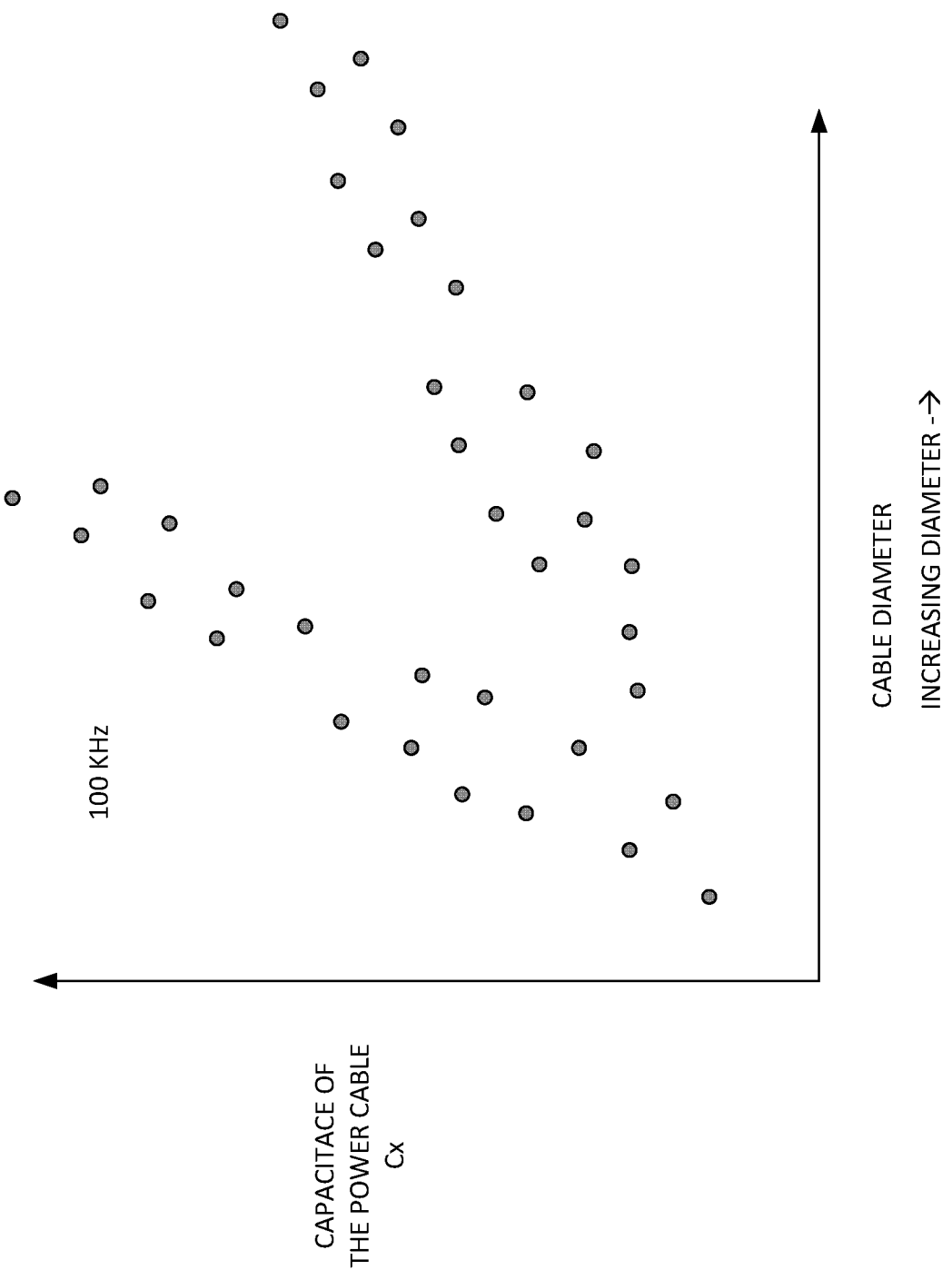
Figure 11D:
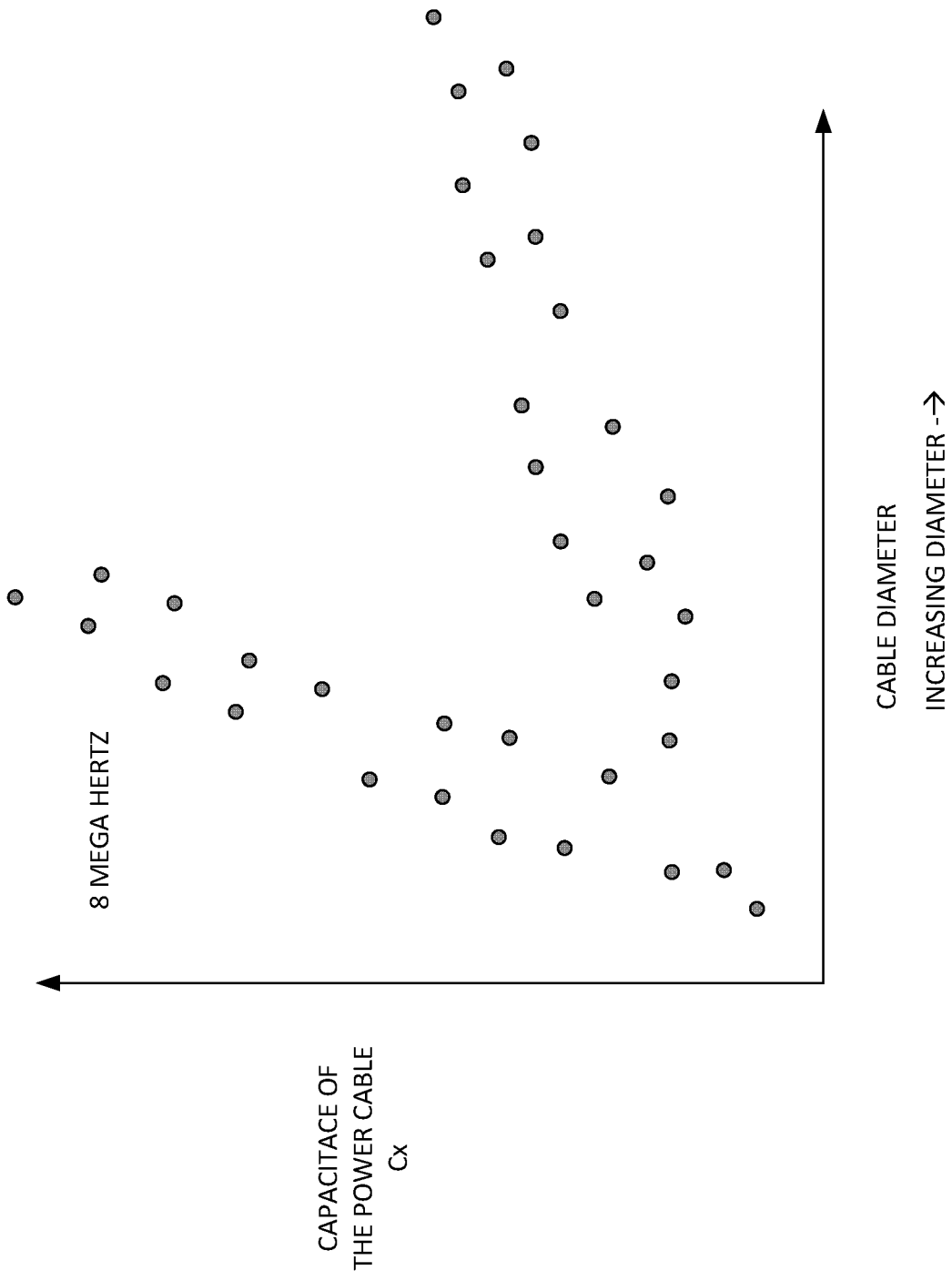

While the capacitance Cx is thought to be linear with increasing measurement frequency, it turns out under further investigation that the capacitance Cx differs significantly with sampling frequency between cable brands. Referring to FIG. 11A, at generally 50/60 hertz, the measured capacitances of various cable brands Cx tends to be generally linearly grouped. Referring to FIG. 11B, at generally 10 kilohertz, the measured capacitances of various cable brands Cx tends to begin to scatter. Referring to FIG. 11C, at generally 100 kilohertz, the relationship between the capacitance of the power cable Cx tends to exhibit a plurality of distinct relationships depending upon the nature of the specific power cable. Referring to FIG. 11D, at generally 10 megahertz the relationship between the capacitance of the power cable Cx tends to exhibit a more distinct plurality of distinct relationships depending upon the nature of the power cable. The dependency of the sampling frequency is thought to be based upon plastizers, colorants, elastomers, recycled materials, and cross linking. Moreover, these characteristics are generally unknown to the purchaser of the power cable and may change for the same power cables manufactured at different times.

With the applied voltage to the power cable at a relatively low primary frequency such as 50/60 Hertz, it is desirable to sample the capacitance at that same frequency. Using the actual applied voltage in normal operation accomplishes this goal. This simplifies the circuit by removing the oscillator 230, buffer and current monitor 210.

Figure 12:
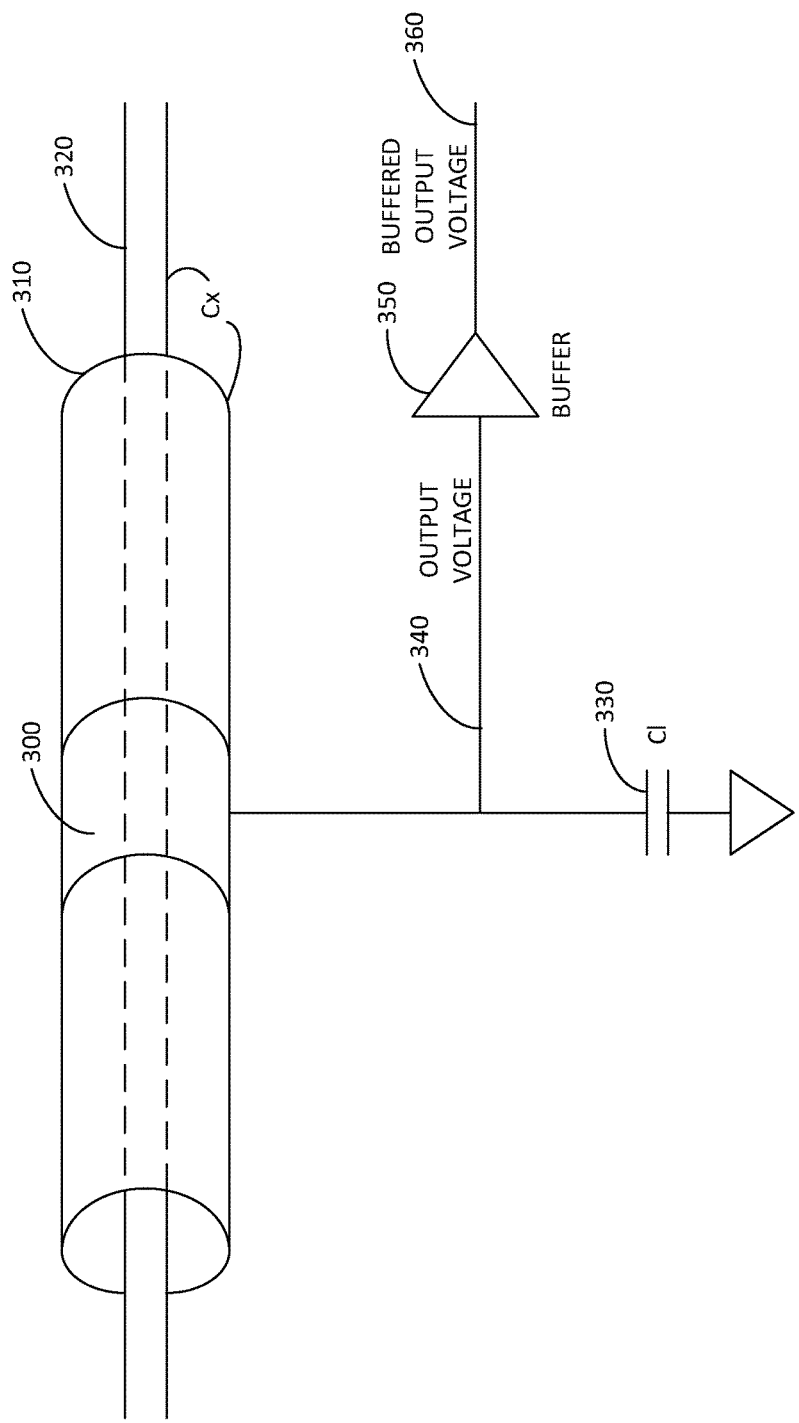
FIG. 12 illustrates another conductor together with a non-contact capacitive based voltage sensor.

Referring to FIG. 12, a conductive member 300 encircles at least a portion of the power conductor to form a capacitance Cx across the dielectric material 310 between the conductive member 300 and the conductor 320. The conductive member 300 is interconnected to a capacitor Cl 330. The capacitor Cl 330 is connected to a voltage potential, such as ground or neutral or otherwise. An output voltage 340 may be selected at the terminal of the capacitor Cl 330, which is representative of the voltage level of the conductor 320. To prevent phase shift, the output voltage 340 is buffered by an operational amplifier 350 to provide a phase-correct output voltage 360. Typically, the capacitance Cx is on the order of 10 picofarads. The capacitor Cl 330 is selected to form a suitable capacitive voltage divider, 10 nanofarads in this case. Other values may be switched in for variable voltage range selection. In this manner, the result of the capacitive divider between Cx and Cl is generally 1,000 to 1. The capacitance Cl (or otherwise an effective capacitance network) is preferably generally between 100 to 1 and 10,000 to 1 of Cx.

Figure 13:
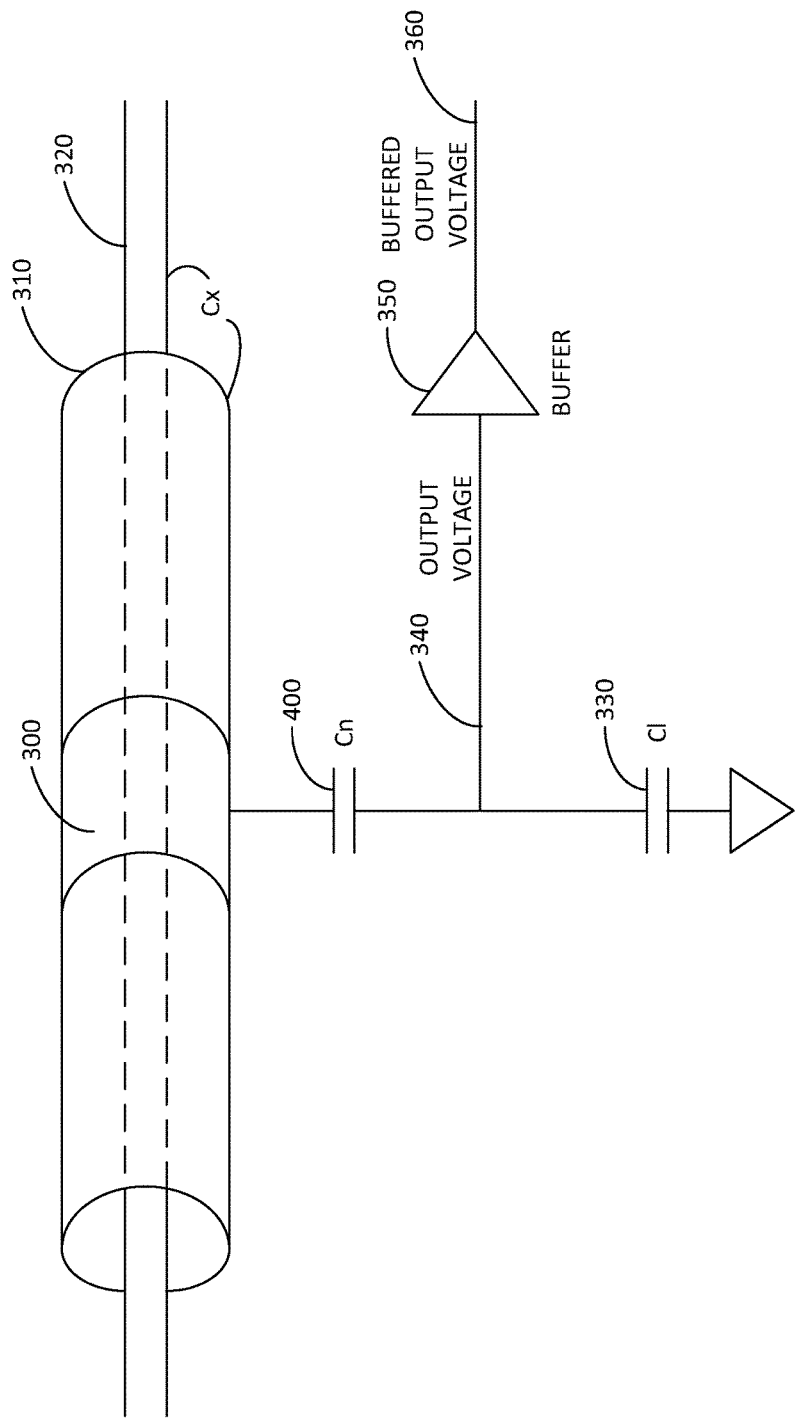
FIG. 13 illustrates another conductor together with a non-contact capacitive based voltage sensor.

Referring to FIG. 13, an additional capacitive element Cn 400 is preferably included between the output voltage 340 and the capacitance of the conductor Cx. Preferably, the value of the capacitive element Cn 400 is within 75% of the value of the capacitance Cx. With the modified capacitive divider network, there remains the unknown for the capacitive value of Cx. For example, for a 10 pF capacitance Cx, the capacitive element Cn 340 is preferably between 2.5 pF and 17.5 pF.

Figure 14:
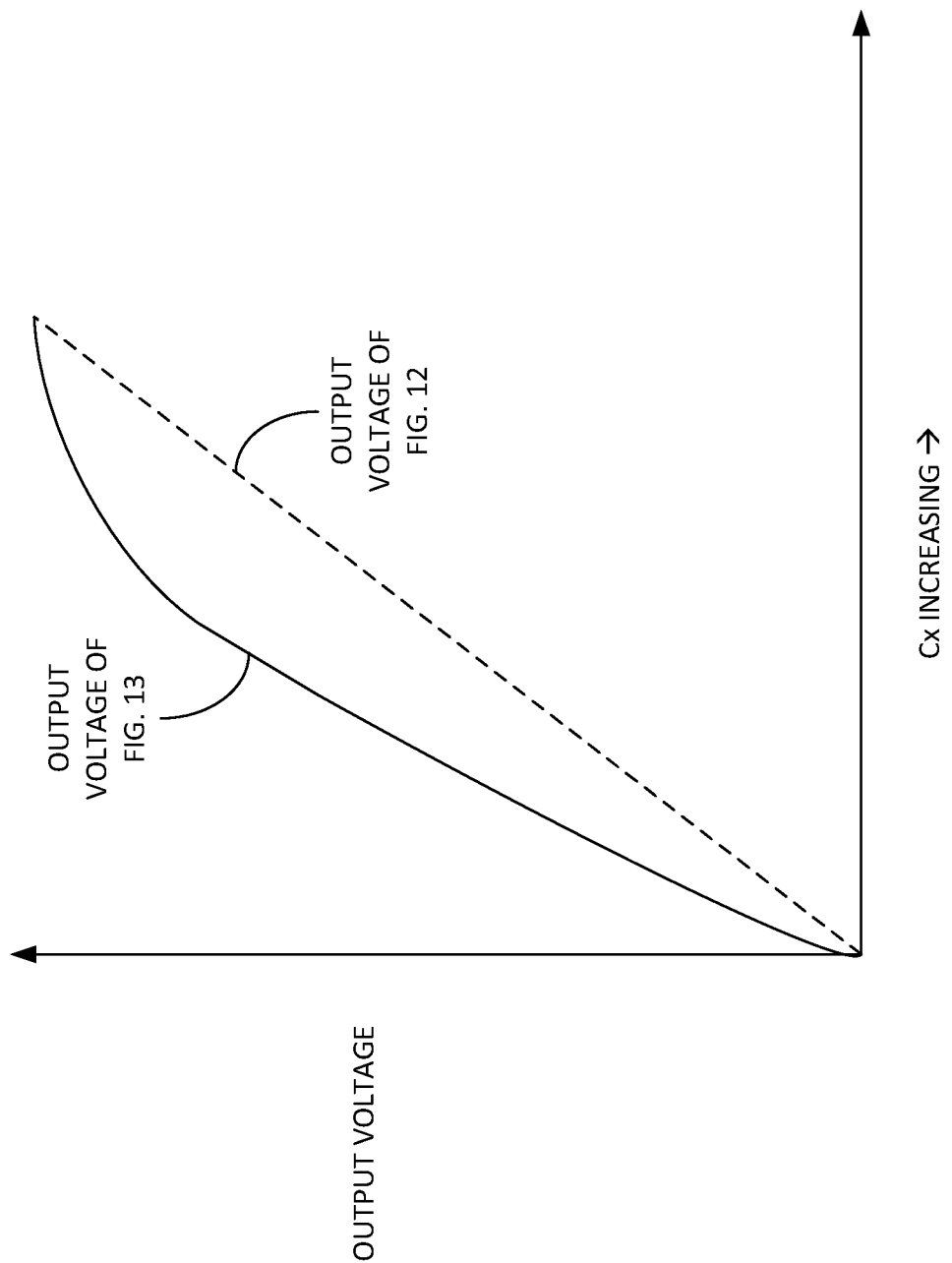
FIG. 14 illustrates a non-linear graph of the power cable capacitance versus voltage level.

Referring to FIG. 14, with the modified capacitive divider network, rather than a generally linear relationship along the values of Cx that occurs without including capacitor Cn, a curved relationship exists along the values of Cx with respect to the output voltage 340. In this manner, there is a non-linear relationship among the values of Cx with respect to the output voltage.

Figure 15:
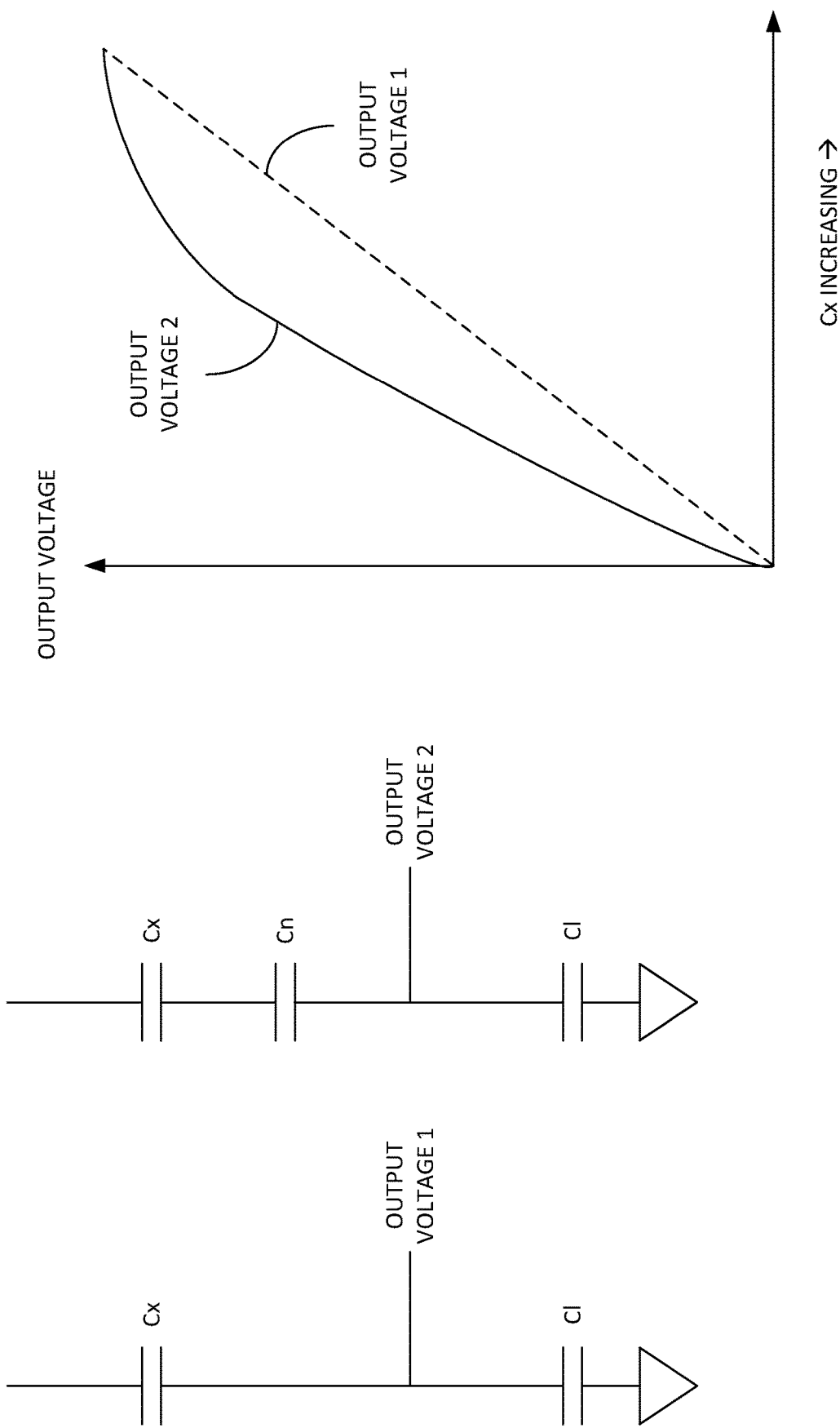
FIG. 15 illustrates non-contact capacitive based voltage sensor circuits and a graph of the power cable capacitance versus voltage levels for the sensor circuits.

Referring to FIG. 15, a pair of different circuit topologies are illustrated. The first circuit topology includes a capacitor Cl with an output voltage 1. The second circuit topology includes capacitors CI and Cn with an output voltage 2, where the first and second voltage outputs are selected from the same electrical potential. The two circuits may be separate from one another, if desired. The output from the output voltage 1 (the dashed line) and the output voltage 2 (the solid curved line) are illustrated superimposed on the same graph, with the changing capacitance Cx of the conductor. The value of the capacitive elements may be selected so that the upper portion of the plots coverage at a value insubstantially greater than the anticipated value of the capacitance of the power conductor. The slopes of the two plots in this range are substantially different from one another and accordingly the capacitance Cx can be determined with some confidence in its accuracy. Typically, this is the upper third of the range of the plot. The slopes of the two plots in the middle third of the range of the plot have large Cx change between the two sets of values, and leaves considerable uncertainty in the actual value of Cx. The slops of the two plots in the lower third of the range of the plot are generally not useful in determining Cx.

Figure 16:
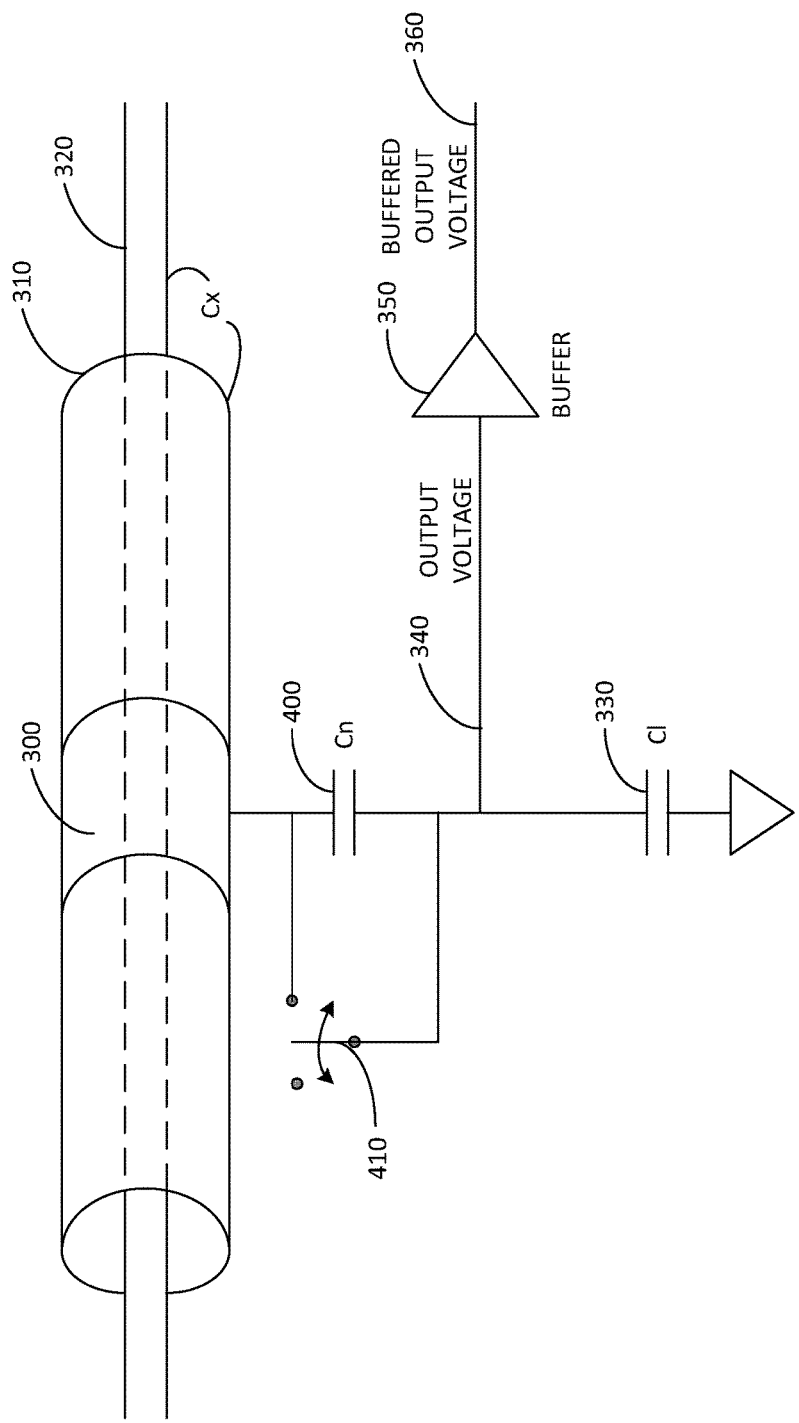
FIG. 16 illustrates a conductor together with a non-contact capacitive based voltage sensor that includes a switch.

Referring to FIG. 16, one technique to determine Cx is to selectively measure both the first output voltage and the second output voltage by alternatively including the capacitance Cn in the circuit using a switch 410. The switch 410 may effectively electrically interconnect the two terminals of the capacitance Cn to form a short circuit when measuring the second output voltage. Based upon the first and second output voltages, one with capacitance Cn included and another with Cn not included, the approximate value of the power conductor capacitance Cx may be determined. Alternatively, a pair of different circuits may be used to determine a pair of different output voltages from which Cx may be determined. Preferably, the switch 410 is switched between shorting and not shorting the capacitor Cn 400 at the rate previously described.

Figure 17:
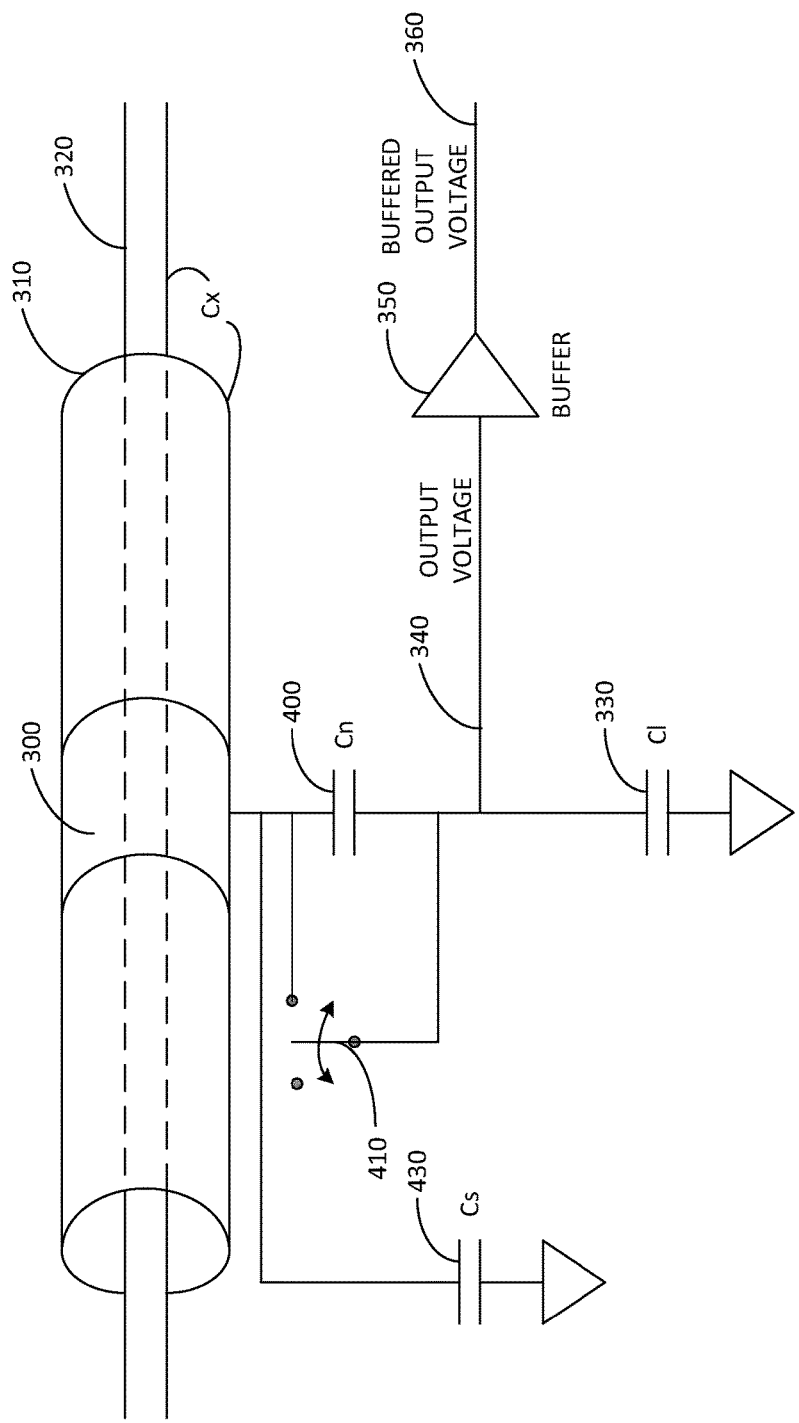
FIG. 17 illustrates a conductor together with a non-contact capacitive based voltage sensor that includes a switch and a stray capacitance.

Referring to FIG. 17, stray capacitances Cs 430 will occur in the fixturing and should be kept small. In this example, the stray capacitance Cs should be preferably less than 2 pF. To the extent that stray capacitance Cs 430 is generally known in its value, to the extent that stray capacitance Cs is general relatively small, and to the extent that stray capacitance Cs is relatively constant under different conditions, then the stray capacitance Cs is more readily accounted for in the estimation of the capacitance Cx to increase the accuracy of the measurements.

To maintain control over the stray capacitance Cs, it is preferable not to use a foil material wrapped around the conductor because it tends to incur substantial flexing and bubbling during temperature variations. Rather, it is desirable to use a mechanical fixture, such as for example a split core housing illustrated in FIGS. 1-7.

Figure 18:
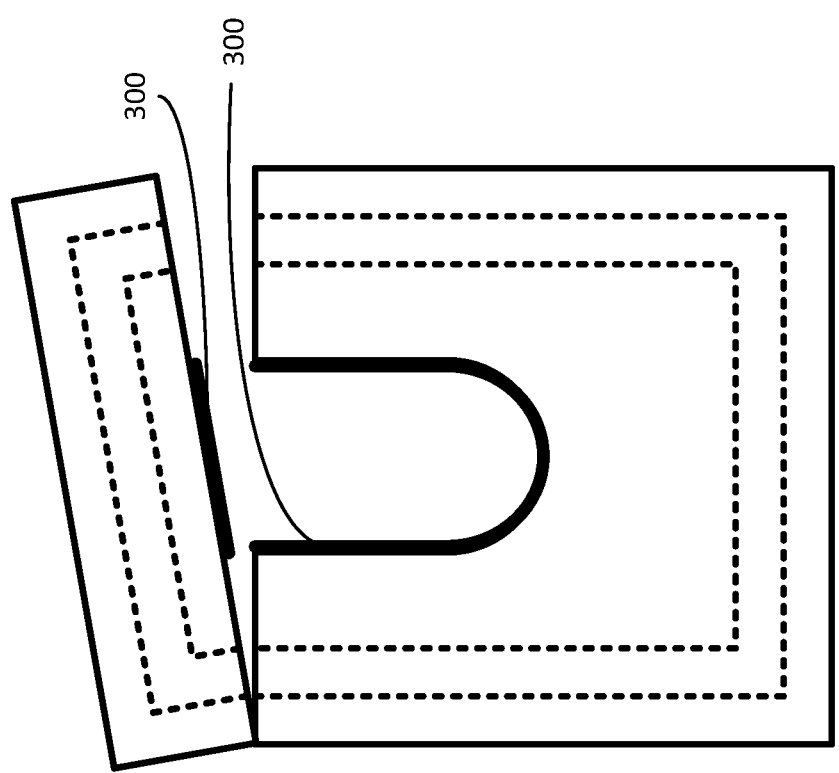
FIG. 18 illustrates a housing with a non-contact capacitive plate.

Referring to FIG. 18, it is desirable to form the capacitive conductor 300 of the non-contact voltage sensor on the exterior surface of the opening defined by the split-core housing, preferably using a plating process. The capacitive conductor may be on an interior surface or supported therein, if desired. In this manner, the conductor is preferably not readily removable from the housing. The remaining electronics associated with the non-contact voltage sensor are preferably enclosed within the housing. The capacitive conductor 300 meaintained in a fixed position relative to the housing tends to reduce the variability of the stray capacitance Cs.

Referring to FIG. 19, in another embodiment the capacitive conductor 300 of the non-contact voltage sensor may be selected from a plurality of different sizes to accommodate cables of different diameters. For example, a first size may be a relatively long length capacitive conductor that provides for a relatively small capacitance Cx of smaller cables. For example, a second size may be a medium length capacitive conductor that provides for a medium capacitance Cx of medium cables. For example, a third size may be a relatively short length capacitive conductor that provides for a relatively large capacitance Cx of large cables. Each of the first size, second size, and third size capacitive conductors may be sized to be suitable to be engaged within the opening of the same split-core housing, attached the capacitive conductors may extend beyond the width of the housing. In this manner, the same housing, with a selected capacitive conductor engaged, may be used to effectively sense the voltage of the power cable using a non-contact capacitive sensing technique. This selection among the different capacitive conductor facilitates a suitable value of the capacitance so that a more accurate Cx is determined. This capacitive conductor tends to reduce the variability of the stray capacitance Cs. Also, the selected capacitive conductor may be automatically electrically connected to the circuit upon engagement with the housing.

Figure 20:
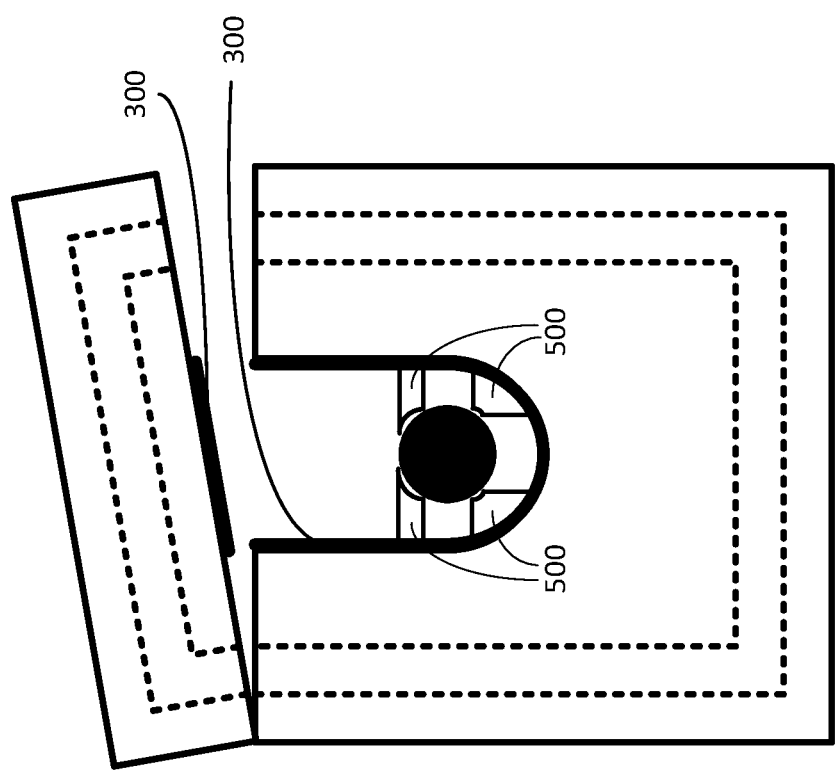
FIG. 20 illustrates a housing with an alignment structure for a non-contact capacitive plate.

Referring to FIG. 20, in another embodiment the enclosure may include an alignment structure 500, such as a plurality of ribs or otherwise a web structure arranged around the central opening. The alignment structure facilitates maintaining the power conductor in a centralized position. In addition, the alignment structure preferably includes some flexibility. Moreover, preferably each of the set of capacitive conductors may be selectively included together with alignment structure. This capacitive conductor tends to reduce the variability of the stray capacitance Cs.

Figure 21:
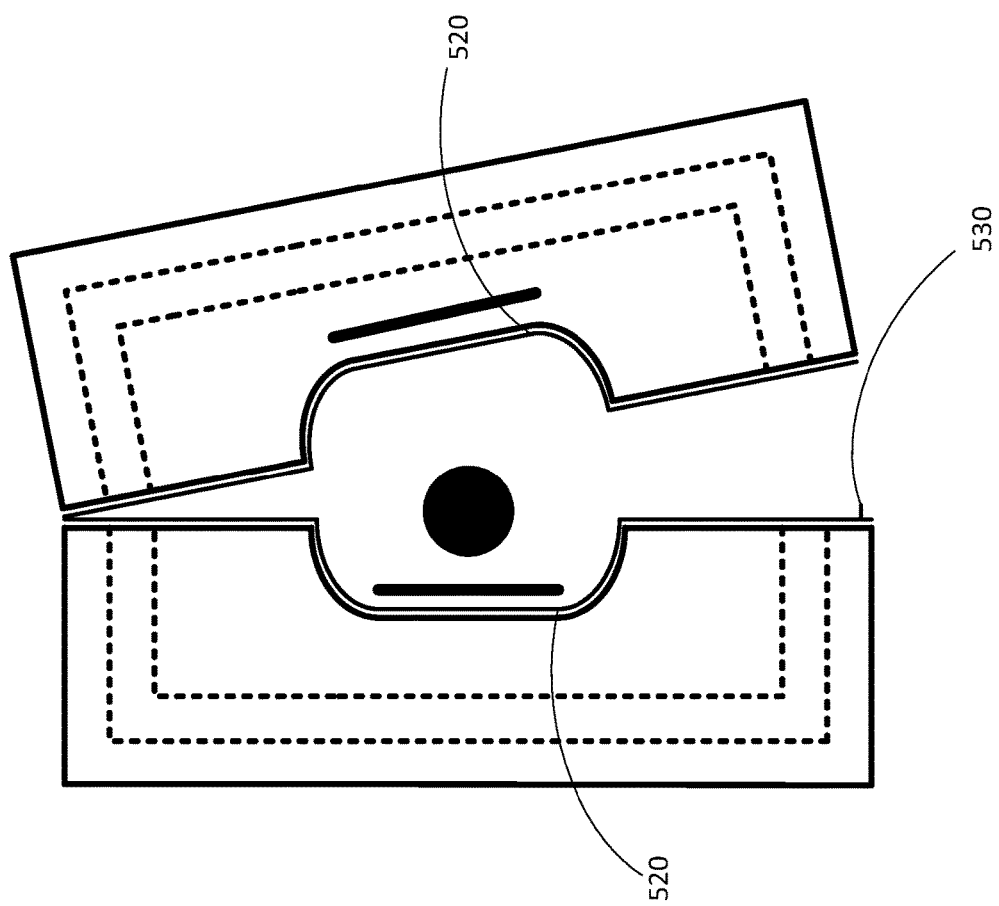
FIG. 21 illustrates a housing with a shield structure.

Referring to FIG. 21, to further reduce the effects of the stray capacitance Cs, it is preferable to include a shield conductor 520 that may substantially encircle the power conductor. When closed, there may include a tab 530 or other structure that effectively ensures that the shield conductor forms a closed loop. The capacitive conductor may be maintained within the shield conductor 520 and preferably extends beyond the shield conductor 520 in its width. The capacitive conductor may be maintained external to the shield conductor 520 and preferably extends beyond the shield conductor 520 in its width.

Figure 22:
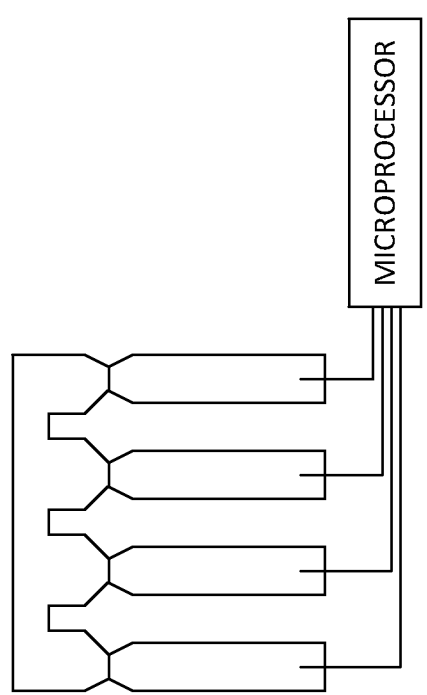
FIG. 22 illustrates an identification structure for a non-contact capacitive plate.

Referring to FIG. 22, the capacitive conductor may be identified by an electrical structure together with a processor. The electrical structure may include plated-on conductors such that a combination of one or more of the conductors being shorted may be used to identify the corresponding capacitive conductor. By way of example, a binary coded technique using 4 conductors may be used to identify up to 16 different parameters including cable capacitance range and stray capacitance. Other electrical and/or mechanical structures may be used to identify the corresponding capacitive conductor associated with the particular housing.

As previously described, it is to be understood that the non-contact voltage sensor may self-calibrate on a periodic basis or otherwise self-calibrate on a substantially continual basis. Moreover, after the non-contact voltage sensor is engaged with the power cable, it does not require any calibration to properly measure the voltage levels and self-calibrates over time to maintain the calibration. In this manner, the non-contact voltage sensor may compensate for thermal drift, mechanical movement, or otherwise. Moreover, the non-contact voltage sensor has low power consumption permitting effective self-powering by a corresponding transformer.

By way of example, one calculation that may be used to determine the capacitance based upon $Vin=(Vout-B2)*A2/Cx$ for the linear relationship, and $Vin=(Vcap-B1)*A1*(Cx+Cn+Cs)/Cx$ for the non-linear relationship. The differences between the two measurements facilitates the determination of Cx as $Cx=((Vout-B2)*A2/(Vcap-B1)*A1)-Cn-Cs$. Both of the measurements preferably use a 50 hertz to 60 hertz voltage under test as the excitation voltage to reduce the dielectric contact variations with frequency. Moreover, the housing may provide a power output signal based upon the voltage levels and the current levels. Other measurement circuit topologies may likewise be used, together with other capacitive elements, together with inductive elements, together with resistive elements, together with active elements, etc.

In some embodiments, the system may include two or more phases of a multi-phase system.

All the references cited herein are incorporated by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

The invention claimed is:

1. A sensor for determining voltage of a signal within a power cable, where said signal has a fundamental frequency, comprising:
    (a) a housing configured to be coupled around at least a portion of said power cable;
    (b) at least one conductive element supported by said housing and configured to be electrically coupled to said signal within said power cable when said housing is positioned around at least a portion of said power cable;
    a first capacitive element supported by said housing and electrically interconnected with said at least one conductive element;
    a second capacitive element supported by said housing and electrically interconnected with said first capacitive element which is electrically interconnected with said at least one conductive element, where said second capacitive element is not directly electrically interconnected with any of said at least one conductive element;
    a processor determining a cable capacitance of said power cable based upon, a single input from said first capacitive element and said second capacitive element, alternatively sensing an electrical characteristic of:
        said first capacitive element and said second capacitive element resulting in a first characteristic relationship between said cable capacitance and said voltage, at a position electrically located between the first capacitive element and the second capacitive element, as said voltage changes over time based upon a sampling frequency that is substantially the same as said fundamental frequency of said signal;
        said first capacitive element without said second capacitive element resulting in a second characteristic relationship between said cable capacitance and said voltage, at said position electrically located between the first capacitive element and the second capacitive element, as said voltage changes over time based upon said sampling frequency that is substantially the same as said fundamental frequency of said signal; and
        wherein said determining said cable capacitance is based upon a relationship between said first characteristic relationship and said second characteristic relationship;
    said sensor determining said voltage of said signal of said power cable based upon said determined cable capacitance.

2. The sensor of claim 1 further comprising a switch element supported by said housing that selectively includes said second capacitive element in determining said electrical characteristic.

3. The sensor of claim 1 wherein said electrical characteristic is a voltage level set by said first capacitive element.

4. The sensor of claim 3 wherein a buffered electrical characteristic is based upon said electrical characteristic.

5. The sensor of claim 1 wherein said first capacitive element has a capacitance value between 100 to 1 and 10,000 to 1 of said cable capacitance.

6. The sensor of claim 1 wherein said second capacitive element has a capacitance value within 75% of the value of said cable capacitance.

7. The sensor of claim 1 wherein said first capacitive element and said second capacitive element are arranged in a voltage divider configuration.

8. The sensor of claim 1 wherein the plurality of conductive elements are supported by said housing in a fixed relationship with respect to said housing.

9. The sensor of claim 8 wherein the plurality of conductive elements are supported by an exterior surface of said housing.

10. The sensor of 14 wherein the plurality of conductive elements are affixed to said housing using a plating process.

11. The sensor of claim 8 wherein the plurality of conductive elements are detachably engageable with said housing.

12. The sensor of claim 11 wherein the plurality of conductive element elements are selectable from a plurality of different sizes and engageable with said housing.

13. The sensor of claim 11 wherein characteristics of the plurality of conductive elements are determined by said processor.

14. The sensor of claim 13 wherein the plurality of conductive element elements are determined based upon a modifiable electrical structure.

15. The sensor of claim 13 wherein the plurality of conductive element elements are determined based upon a modifiable mechanical structure.

16. The sensor of claim 1 wherein the plurality of conductive elements are operatively connected via a hinge to the housing.

17. The sensor of claim 1 wherein the plurality of conductive elements are triangle shaped.

18. The sensor of claim 1 wherein the plurality of conductive elements are semi-circular shaped.

19. The sensor of claim 1 wherein the housing is made of an electrically insulating thermoplastic material such as nylon, polyvinyl chloride (PVC), or polycarbonate.

* * * * *

UNITED STATES PATENT AND TRADEMARK OFFICE
CERTIFICATE OF CORRECTION

PATENT NO. : 11,193,958 B2
APPLICATION NO. : 15/788139
DATED : December 7, 2021
INVENTOR(S) : Randall Brant Elliott et al.

It is certified that error appears in the above-identified patent and that said Letters Patent is hereby corrected as shown below:

In the Specification

At Column 1, Line 7: Replace "2017," with --2017.--;

At Column 8, Line 24: Replace "general" with --generally--;

At Column 8, Line 45: Replace "meaintained" with --maintained--;

At Column 10, Line 44: Replace "first" with --second--;

At Column 10, Line 44: Replace "second" with --first--;

In the Claims

At Column 11, Line 1 (Claim 5): Replace "first" with --second--; and

At Column 11, Line 4 (Claim 6): Replace "second" with --first--.

Signed and Sealed this
Eighth Day of November, 2022

Katherine Kelly Vidal
*Director of the United States Patent and Trademark Office*